(12) United States Patent
Smith

(10) Patent No.: US 7,292,421 B2
(45) Date of Patent: Nov. 6, 2007

(54) LOCAL ESD POWER RAIL CLAMP WHICH IMPLEMENTS SWITCHABLE I/O DECOUPLING CAPACITANCE FUNCTION

(75) Inventor: Jeremy Charles Smith, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 125 days.

(21) Appl. No.: 10/987,358

(22) Filed: Nov. 12, 2004

(65) Prior Publication Data

US 2006/0103994 A1    May 18, 2006

(51) Int. Cl.
*H02H 3/20* (2006.01)
*H02H 9/04* (2006.01)

(52) U.S. Cl. ................... 361/56; 361/91.1; 361/111
(58) Field of Classification Search ............ 361/56, 361/111, 91.3, 91.1
See application file for complete search history.

(56) References Cited

U.S. PATENT DOCUMENTS

| 5,789,964 | A  | * | 8/1998  | Voldman ............ 327/380 |
| 6,385,021 | B1 | * | 5/2002  | Takeda et al. ......... 361/56 |
| 6,724,603 | B2 | * | 4/2004  | Miller et al. .......... 361/111 |
| 6,801,416 | B2 | * | 10/2004 | Hatzilambrou et al. ..... 361/56 |
| 6,949,967 | B2 | * | 9/2005  | Wang et al. ........... 327/337 |

* cited by examiner

*Primary Examiner*—Michael Sherry
*Assistant Examiner*—Zeev Kitov
(74) *Attorney, Agent, or Firm*—Alan K. Stewart; W. James Brady; Frederick J. Telecky, Jr.

(57) ABSTRACT

Methods and circuits are disclosed for providing distributed ESD protection switchable between a capacitive decoupling state and an ESD protection state. The invention provides electronic circuitry with a selectable capacitive decoupling path and an ESD shunting path responsive to the detection of the presence or absence of an electrostatic discharge event. Circuits of the invention include one or more control circuits, electrostatic discharge devices, and control nodes operably coupled to responsively switch the circuit from a decoupling state to an electrostatic discharge state.

5 Claims, 7 Drawing Sheets

LOCAL ESD POWER RAIL CLAMP WHICH IMPLEMENTS SWITCHABLE I/O DECOUPLING CAPACITANCE FUNCTION

TECHNICAL FIELD

The invention relates to semiconductor devices and microelectronic circuitry. More particularly, it relates to electrostatic discharge (ESD) protection devices and methods.

BACKGROUND OF THE INVENTION

Electrostatic discharge (ESD) events can cause damage to elements of circuitry due to excessively high voltages or currents. For example, the propagation of an ESD event through a circuit may cause a transistor to greatly exceed its voltage or current capacity, suffer physical damage, and subsequently fail. The potential for failure increases as circuitry becomes smaller and as operating voltage levels are reduced. ESD events may occur due to a relatively short period of relatively high voltage or current imposed on a device. For example, ESD events are sometimes caused by contact with the human body, by machinery such as manufacturing or test equipment, or in electrically active environments, as may be incurred in many consumer applications. A variety of ESD events can occur in electronic devices, including discharge between the pads of an integrated circuit, discharge between voltage supply terminals, and discharge between pads and voltage supply terminals. Various kinds of ESD protection circuitry are used in the art to protect ICs from the damage due to the occurrence of ESD events during manufacture, testing, and operation. In general, ESD protection circuitry is designed to protect the input/output circuitry and internal circuitry of an integrated circuit from excessively large and sudden discharges of electrostatic energy.

One known approach is to provide ESD protection external to the microelectronic circuit. Among other problems, this approach can adversely affect the load capacitance, resistance, speed, linearity, frequency response, stability, or slew rate of the circuitry. Another potential solution is to make the circuitry better able to withstand higher voltages Of ESD event. This solution can also adversely affect the performance of the circuit, and is unacceptable for many applications. External ESD protection circuitry can also be placed within the functional circuit path. In many applications, however, extra loading and capacitance is unacceptable. Additional challenges to providing ESD protection in IC devices lie in the ever-present desire to reduce die area, and to reduce current leakage.

Due to these and other problems, a need exists for circuits and methods that provide microelectronic circuits with the ability to withstand ESD events without adversely impacting the performance of the functional circuit path during normal operation.

SUMMARY OF THE INVENTION

In carrying out the principles of the present invention, in accordance with preferred embodiments thereof, methods and circuits of the invention are described with reference to exemplary embodiments providing distributed ESD protection switchable between a capacitive decoupling state and an ESD protection state.

According to one aspect Of the invention, a method is provided by which a circuit may be endowed with a selectable capacitive decoupling path and an ESD shunting path responsive to the detection of the presence or absence of an electrostatic discharge event.

According to another aspect of the invention, a circuit embodiment includes an control circuit, an electrostatic discharge device, and a control node operably coupled to switch the circuit from a decoupling mode to an electrostatic discharge mode responsive to an electrostatic discharge event.

According to another aspect of the invention, a circuit embodiment includes a plurality of electrostatic discharge responsive subcircuits. The electrostatic discharge responsive subcircuits further include control circuits, electrostatic discharge devices, and a control node. The configuration is operative to switch the electrostatic discharge responsive subcircuits from a decoupling mode to an electrostatic discharge mode responsive to an electrostatic discharge event providing a shunting path for dissipation of the electrostatic discharge.

The invention provides technical advantages including but not limited to providing selectable capacitive decoupling and ESD shunting responsive to the occurrence of ESD events. These and other features, advantages, and benefits of the present invention can be understood by one of ordinary skill in the art upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to the references in the figures unless otherwise noted. Descriptive and directional terms used in the written description such as first, second, top, bottom, side, etc., refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DETAILED DESCRIPTION OF PREFERRED EMBODIMENTS

In general, the methods and circuits of the invention provide improved ESD protection in microelectronic circuits. During normal operation, the invention functions as a decoupling capacitor between the power supply nodes of an associated electronic circuit. The invention responds to the occurrence of an ESD event by providing a local power clamp for dissipating the ESD current.

Figure 1:
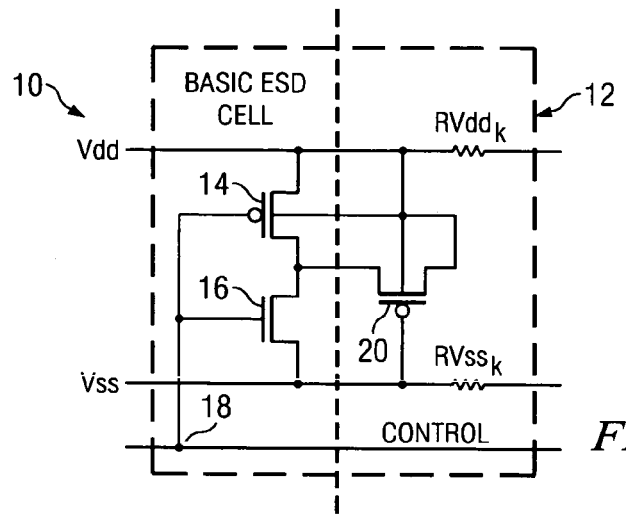
FIG. 1 is a schematic diagram of an example of a preferred embodiment of an ESD protection cell according to the invention.

Referring primarily to FIG. 1, a schematic circuit diagram illustrates an example of a preferred embodiment of an ESD protection cell 10 according to the invention. A control circuit 12 is provided between the power rails Vdd, Vss within the context of an associated circuit (not shown). Preferably, as shown in FIG. 1, the control circuit 12 uses a first PMOS transistor 14 and a second NMOS transistor 16 coupled to a control node 18 in a suitable configuration for activation by a control signal as further described herein. It should be apparent to those skilled in the arts that parasitic resistance will be inherent in the components; these resistances are denominated in the figures as $R_{V_{ddk}}$ and $R_{V_{ssk}}$. An ESD device 20, preferably a PMOS transistor as shown, is coupled between the rails Vdd, Vss, and the transistors 14, 16, of the control circuit 12 in the operable configuration shown. Although one preferred embodiment of an ESD rail clamp circuit 10 of the invention is shown by way of example, it will be recognized by those skilled in the arts that alternative circuit configurations may also be used without departure from the invention, provided the described functionality is achieved.

Figure 2A:
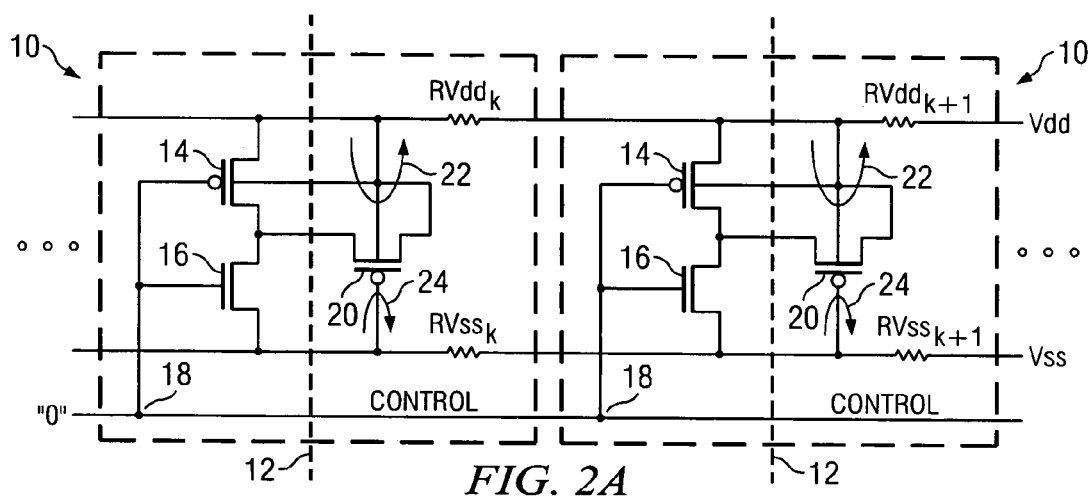
FIG. 2A is a schematic diagram of an example of a preferred embodiment of the invention illustrating operation in a normal mode.

FIG. 2A is a schematic diagram further illustrating the operation of the circuit of FIG. 1 in an example of operation in a "normal," i.e. non-ESD, state. In this example, the control circuit 12 is configured to select the normal mode responsive to a "0" at the control node 18 provided by an ESD detection circuit (not part of the invention). The invention may be used with various ESD detection circuits available in the arts. The first transistor 14 of the control circuit 12 is allowed to conduct, as is the ESD device 20. The second transistor 16 of the control circuit 12 is inactive. Examination of the current paths indicated by arrows 22, 24, reveals that in this state the ESD cell 10 functions as a decoupling capacitor isolating the Vdd and Vss sides of the ESD cell 10. It may be seen in FIG. 2A that it is contemplated to use multiple implementations of the ESD cell 10 of the invention in parallel to provide multiple isolation/rail clamp circuits 10 as further described.

Figure 2B:
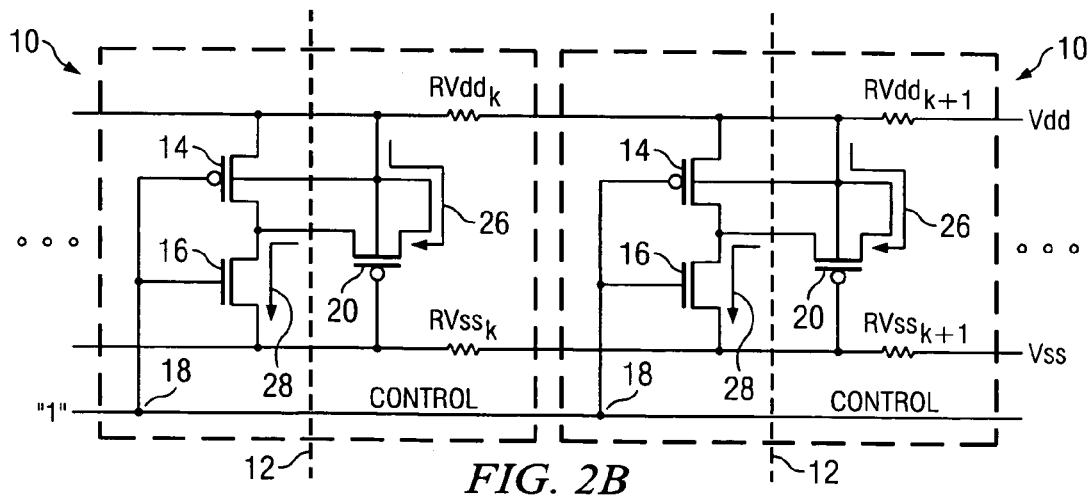
FIG. 2B is a schematic diagram of an example of a preferred embodiment of the invention illustrating operation in a protection mode.

FIG. 2B is a schematic diagram of the example of the preferred embodiment of the invention depicted in FIGS. 1 and 2A illustrating operation of the ESD protection clamp 10 in an ESD protection mode. In this example, a high control signal indicated by "1" is provided at the control node 18. In this state, the first transistor 14 of the control circuit 12 is inactive. Current paths, indicated by arrows 26, and 28, are provided through the ESD device 20 and the second transistor 16 of the control circuit 12. It may be appreciated that in this state, the ESD cell 10 provides a path for shunting current between the circuit rails Vdd, Vss. As in FIG. 2A, multiple implementations of the ESD cell 10 of the invention are shown in parallel providing multiple rail clamps for distributing ESD current.

Figure 3:
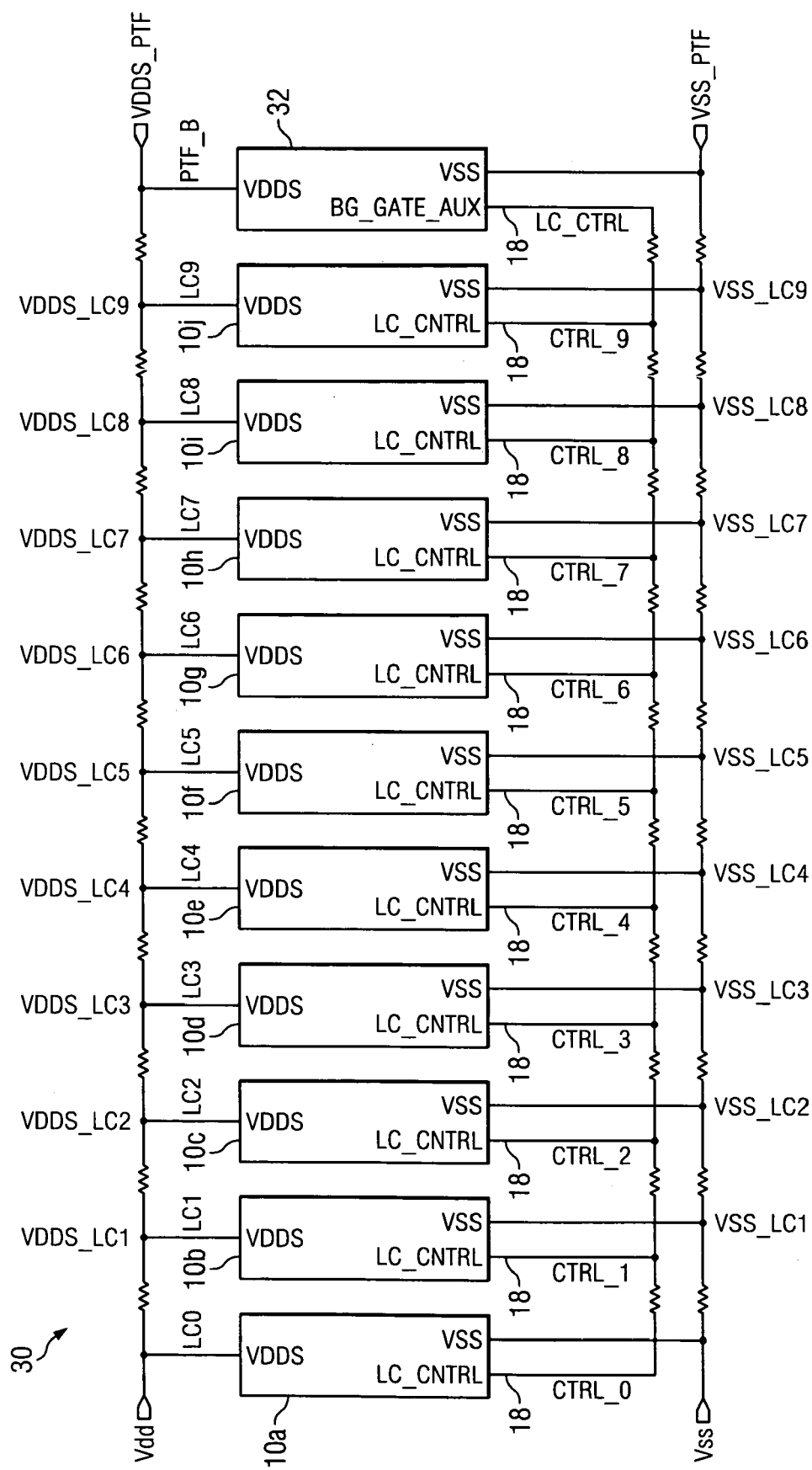
FIG. 3 is a schematic diagram depicting an example of preferred embodiments of the invention deployed at the input/output nodes of a device.

A depiction representative of an implementation of a preferred embodiment of the invention is shown in FIG. 3. Multiple ESD cells 10, are shown in the context of a larger circuit 30. Each of the ESD cells 10 is configured as shown and described with respect to FIG. 1, and functions as either a decoupling circuit or rail clamp circuit in response to a control signal at the control node 18, as shown and described with respect to FIGS. 2A and 2B. In this case, a conventional rail clamp 32 is also coupled between Vdd and Vss. The conventional rail clamp 32 is preferably an "active rail clamp" known in the arts for shunting ESD currents in a circuit 30. Other rail clamps, including conventional rail clamps known in the arts, may alternatively be used in combination with the invention.

Understanding of the operation of the circuit 30 and of the individual rail clamps 10, 32, therein may be further enhanced by reference to FIGS. 4 through 12. For the purposes of this example, a 2 kV human body model (HBM) ESD event is used.

Figure 4:
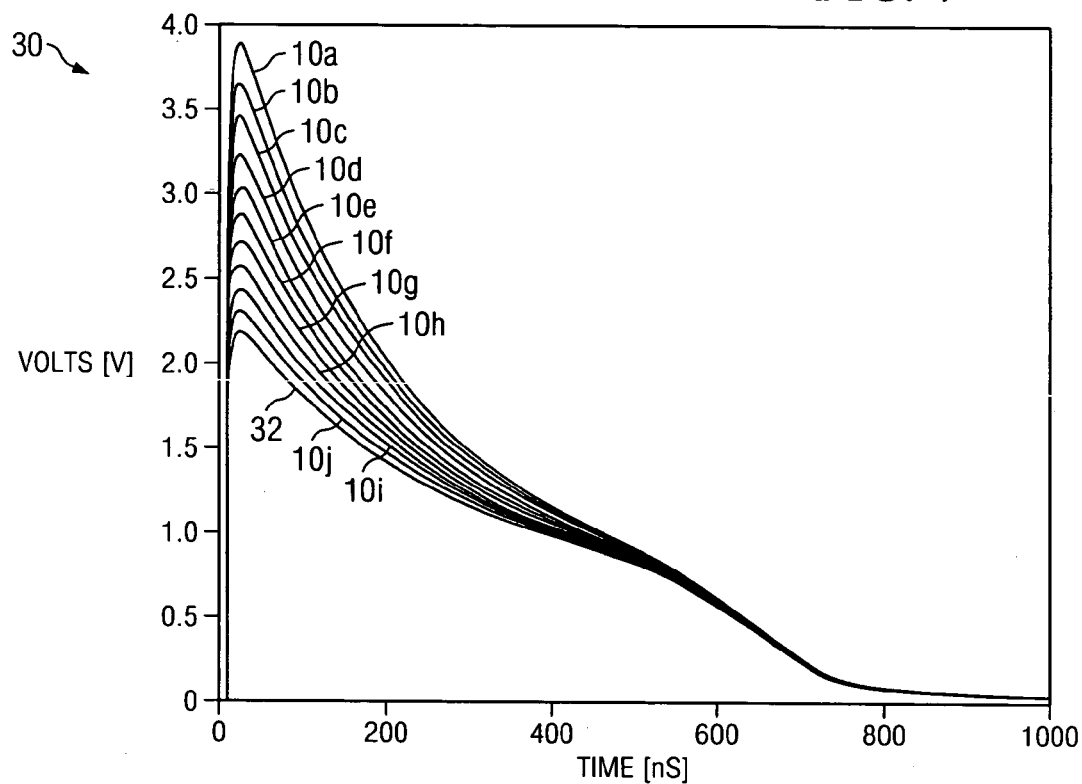
FIG. 4 is a graphical representation of an example of changes in voltages during the operation of the circuit of FIG. 3.

Assuming for the sake of example, a circuit 30 as diagrammed in FIG. 3 is subjected to an ESD event consisting of the application of a HBM voltage on the left side of the figure, and a left side ground, FIG. 4 is a graphical representation of an example of changes in voltages across each ESD discharge element location in the circuit 30 during the ESD event. The changes in voltages across each of the ten successive ESD cell rail clamps 10a, 10b, . . . , 10h, and the active rail clamp 32 are shown. It may be seen that the ESD voltage is shunted across the various clamps 10a, 10b, . . . , 10h, 32.

Figure 5:
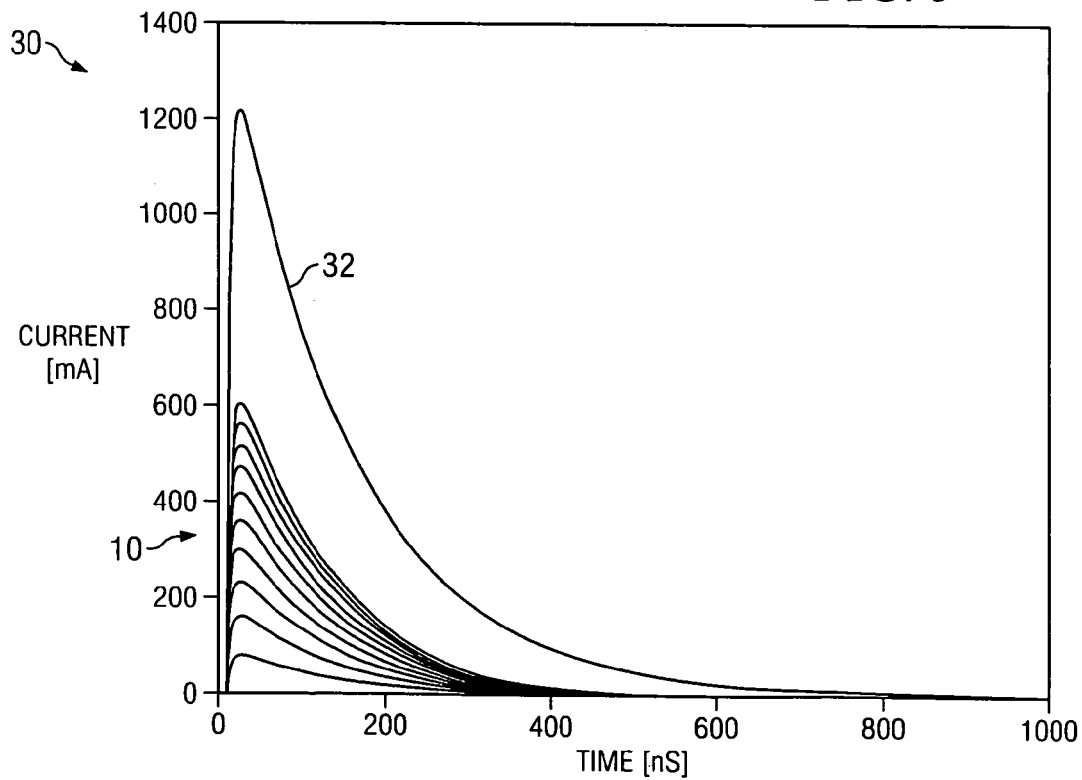
FIG. 5 is a graphical representation of an example of changes in currents during the operation of the circuit of FIG. 3.
Figure 6:
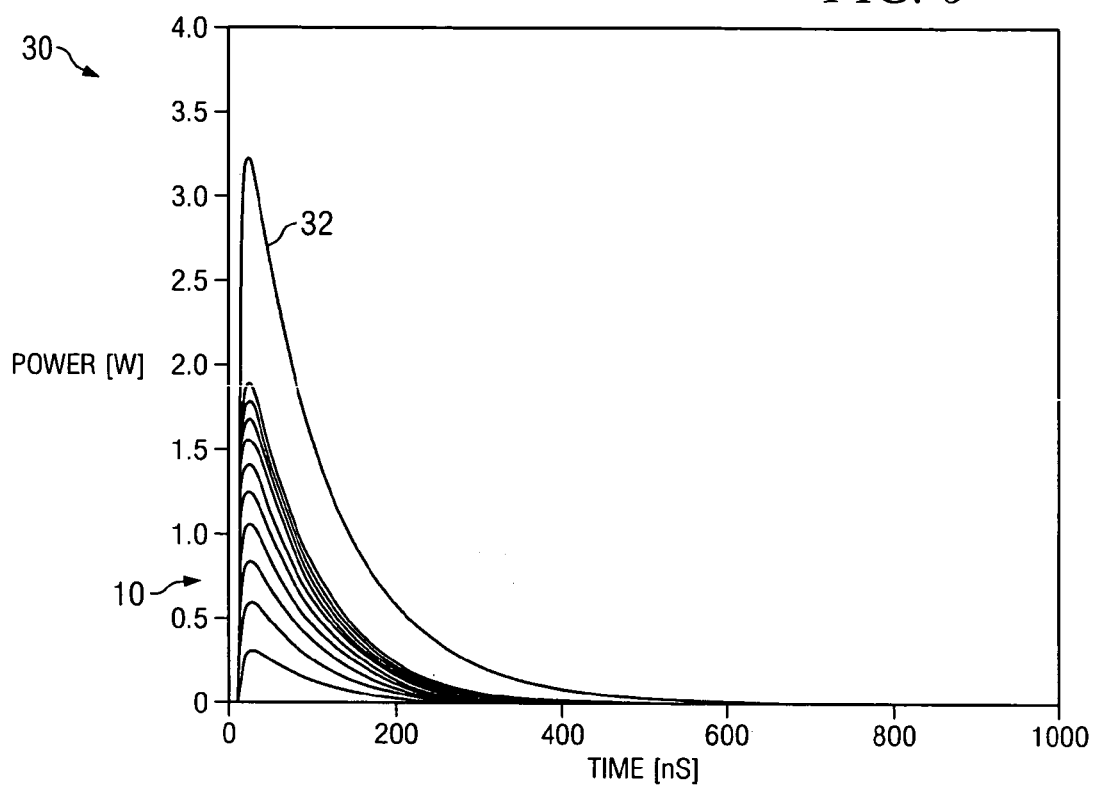
FIG. 6 is a graphical representation of an example of power dissipation during the operation of the circuit of FIG. 3.
Figure 7:
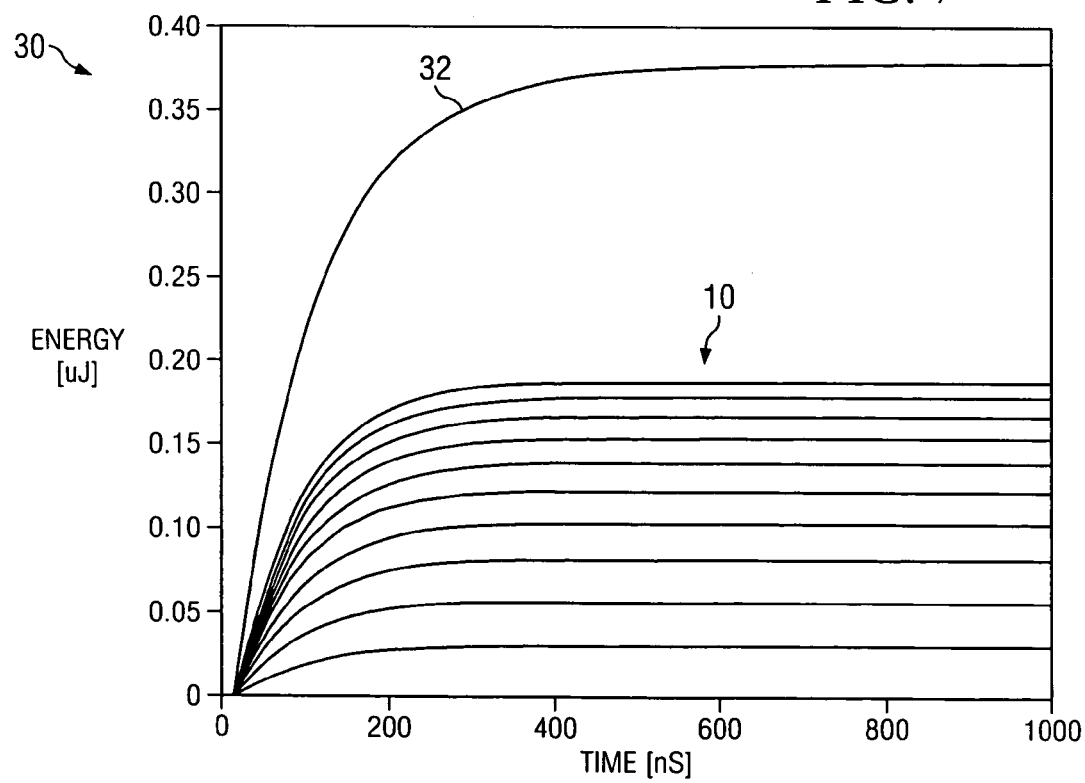
FIG. 7 is a graphical representation of an example of energy dissipation during the operation of the circuit of FIG. 3.

FIG. 5 is a graphical representation of an example of the cumulative discharge of current among the clamps 10a, 10b, . . . , 10h, 32 during the operation of the circuit 30 of FIG. 3. It may be seen that in this example, approximately one-half of the current is discharged by the ESD cells 10a, 10b, . . . , 10h, and about one-half in the active rail clamp 32. Of course, the circuit 30 of this example is a representative example only, and the actual distribution of current within a circuit used to practice the invention may be adjusted by changing the components or configuration of the circuit. FIG. 6 is a graphical representation of an example of the cumulative power dissipation in the circuit 30 of FIG. 3 and its component clamps 10a, 10b, . . . , 10h, 32. Similarly, FIG. 7 is a graphical representation of an example of cumulative energy dissipation during the operation of the circuit 30 of FIG. 3.

Figure 8:
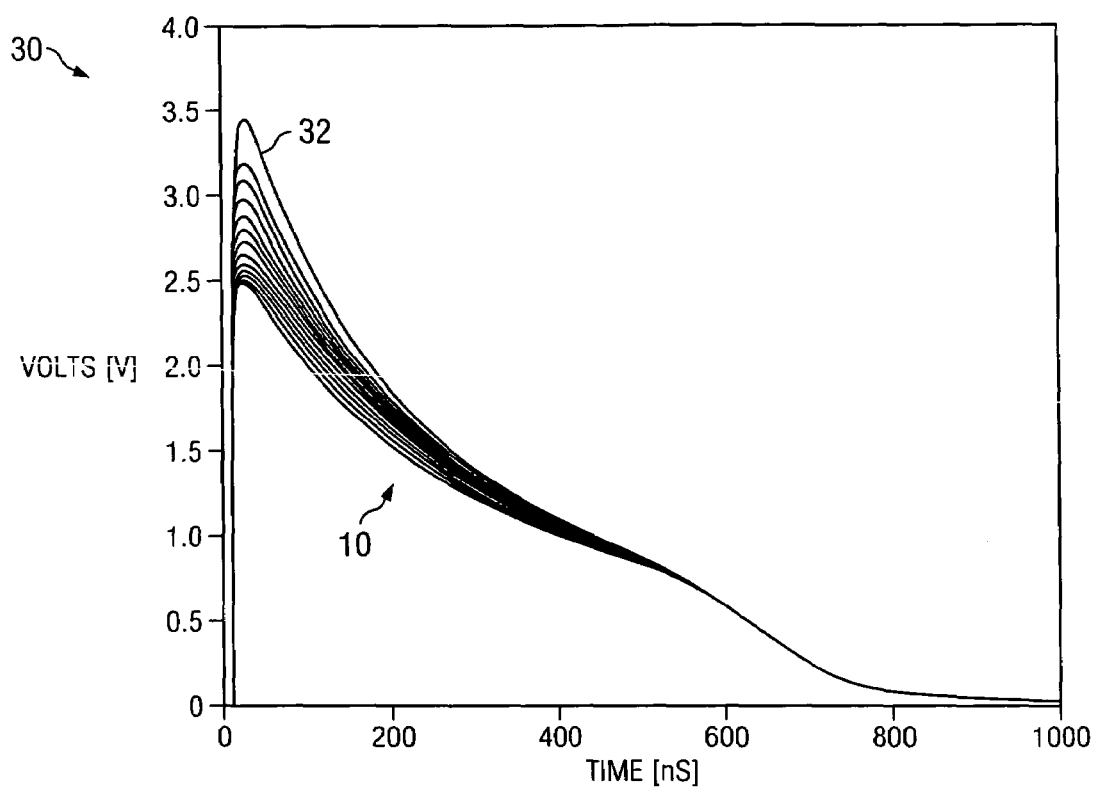
FIG. 8 is a graphical representation of a further example of changes in voltages during the operation of the circuit of FIG. 3.
Figure 9:
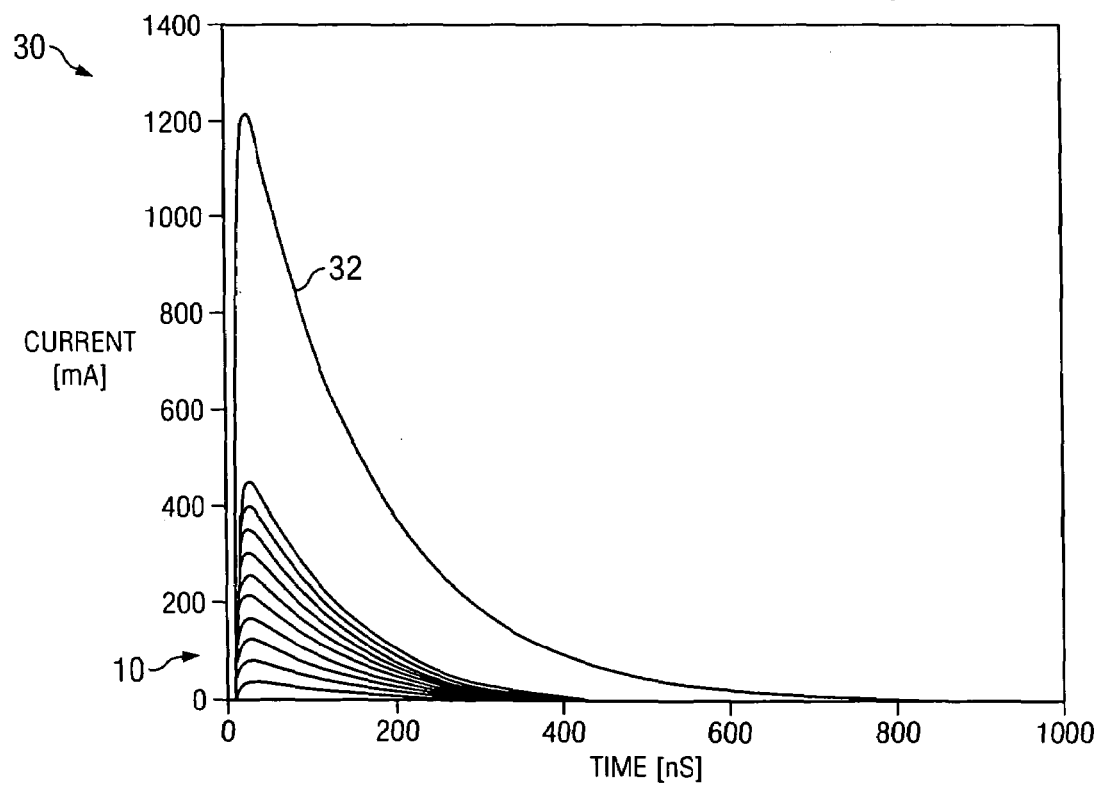
FIG. 9 is a graphical representation of a further example of changes in current during the operation of the circuit of FIG. 3.
Figure 10:
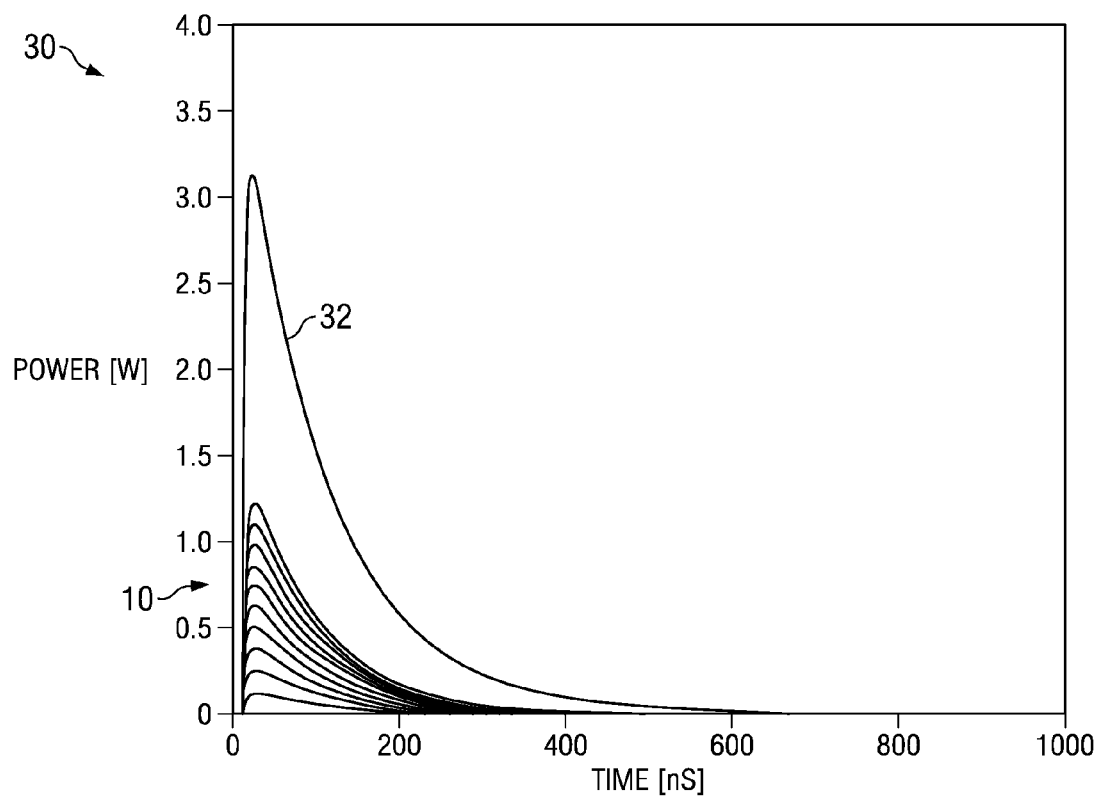
FIG. 10 is a graphical representation of a further example of power dissipation during the operation of the circuit of FIG. 3.
Figure 11:
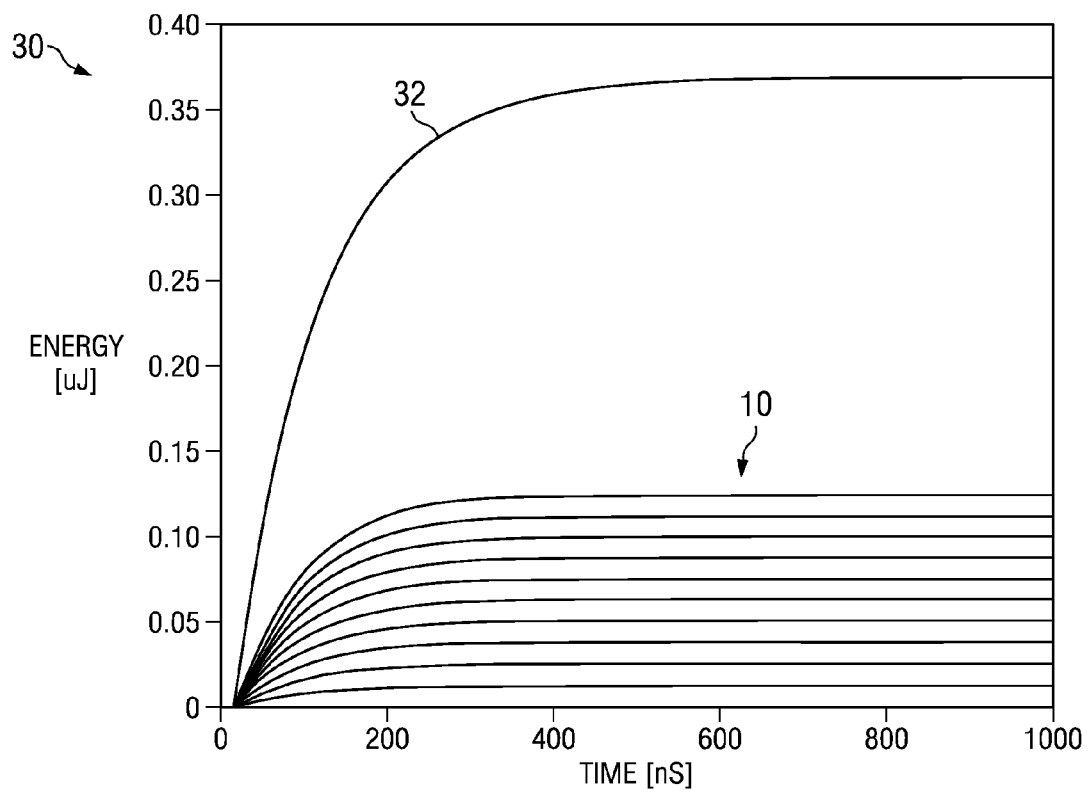
FIG. 11 is a graphical representation of a further example of energy dissipation during the operation of the circuit of FIG. 3.

For the purposes of an additional example, again assuming the circuit 32 diagrammed in FIG. 3 undergoing the occurrence of an ESD event with an application of a HBM voltage on the left side of the figure, and a right side ground, FIG. 8 is a graphical representation of an example of changes in voltages during the operation of the circuit 30 of FIG. 3. The changes in voltages across each of the ten successive ESD cell rail clamps 10a, 10b, . . . , 10h, and the Active rail clamp 32 are shown. It may be seen that the ESD voltage is uniformly distributed across the various clamps 10a, 10b, ... 10h, 32. FIG. 9 is a graphical representation of an example of the cumulative discharge of current among the clamps 10a, 10b, ... 10h, 32 during the operation of the circuit 30 of FIG. 3. It may be seen that in this example, approximately one-third of the current is discharged by the ESD cells 10a, 10b, ..., 10h, and about two-thirds in the active rail clamp 32. FIG. 10 is a graphical representation of an example of the cumulative power dissipation in the circuit 30 of FIG. 3 and its component clamps 10a, 10b, ..., 10h, 32. FIG. 11 is a graphical representation of an example of cumulative energy dissipation during the operation of the circuit 30 of FIG. 3.

Figure 12:
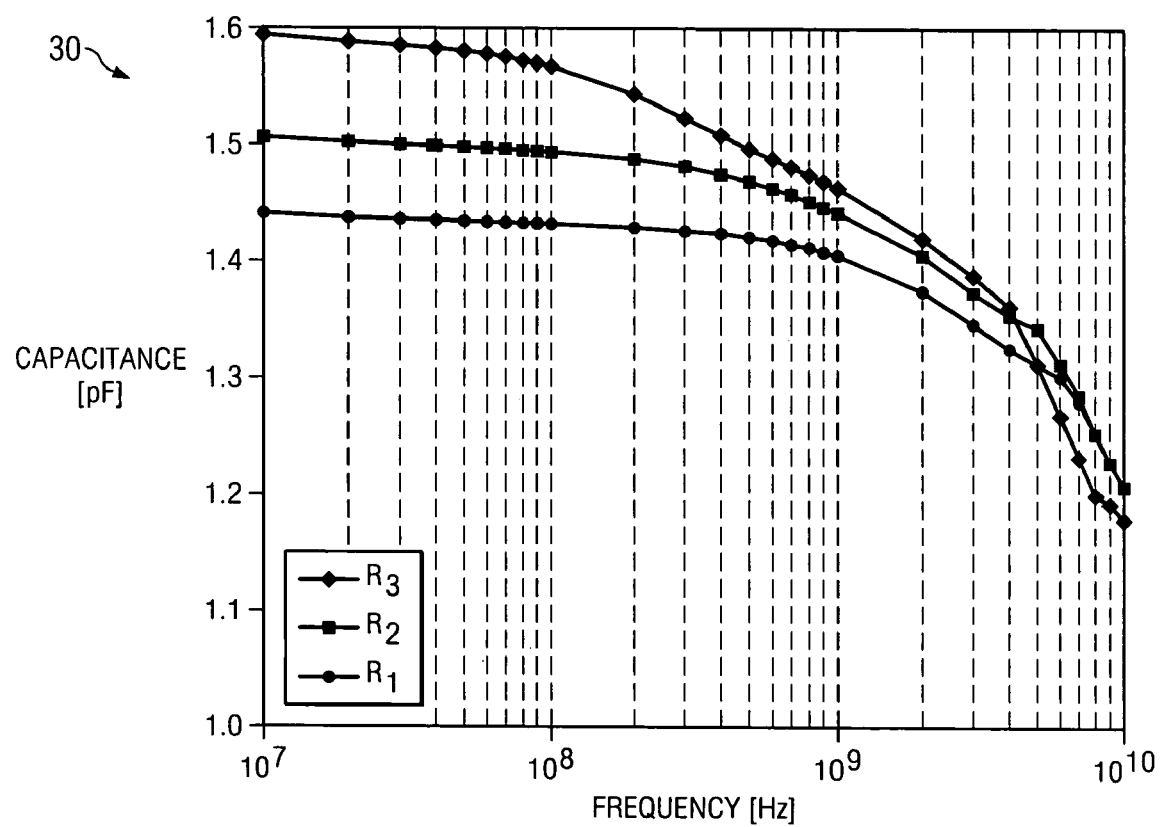
FIG. 12 is a graphical representation of an example of the range of capacitance over a selected frequency spectrum during the operation of the circuit of FIG. 3.

The invention, in addition to providing ESD discharge capabilities, operates to provide an effective decoupling capacitance during conditions when no ESD event is evident, i.e., the majority of the time. FIG. 12 shows a graphical representation of an example of the range of capacitance over a selected frequency spectrum, from $10^7$ Hz to $10^{10}$ Hz, during the operation of the circuit 30 of FIG. 3 for three ranges of transistor strengths $R_1$, $R_2$, $R_3$ implicit to the statistical variation in the manufacturing process.

Thus, the invention provides methods and circuits that provide microelectronic circuits with the ability to withstand ESD events without adversely impacting the performance of the functional circuit path during normal operation. The methods and devices of the invention provide advantages including but not limited to savings in die area, selectable capacitive decoupling and ESD protection capabilities. While the invention has been described with reference to certain illustrative embodiments, the methods and apparatus described are not intended to be construed in a limited sense. Various modifications and combinations of the illustrative embodiments as well as other advantages and embodiments of the invention will be apparent to persons skilled in the art upon reference to the description and claims.

I claim:

1. An electrostatic discharge protection circuit for the protection of a microelectronic device from electrostatic discharge events, the circuit comprising:
   means for detecting an electrostatic discharge event;
   protection transistor configured for operating as a decoupling capacitor during a decoupling capacitor mode and operating as an electrostatic current conducting transistor during an electrostatic discharge protection mode;
   control means operably coupled to the detecting means and protection means;
   whereby the circuit is configured to operate in the decoupling capacitor mode by default and in the electrostatic discharge mode responsive to a signal of the detection means during an electrostatic discharge event.

2. A circuit according to claim 1 wherein the control means comprises a first MOS transistor and a second MOS transistor.

3. A circuit according to claim 1 wherein the protection transistor comprises a MOS transistor.

4. A circuit according to claim 1 wherein the control means comprises a PMOS transistor and an NMOS transistor.

5. A circuit according to claim 1 wherein the protection transistor comprises a PMOS transistor.

* * * * *